(12) United States Patent
Parrish et al.

(10) Patent No.: US 6,316,777 B1
(45) Date of Patent: Nov. 13, 2001

(54) CONSTANT POWER SNAPSHOT MICROEMITTER ARRAY WITH INTEGRAL DIGITAL INTERFACE, ISOLATED SUBSTRATE CURRENT RETURN, AND LINEARIZED SIGNAL RESPONSE

(75) Inventors: William J. Parrish, Santa Barbara; Naseem Y. Aziz, Goleta; Jeffrey L. Heath; Theodore R. Hoelter, both of Santa Barbara, all of CA (US)

(73) Assignee: Indigo Systems Corporation, Santa Barbara, CA (US)

( * ) Notice: Subject to any disclaimer, the term of this patent is extended or adjusted under 35 U.S.C. 154(b) by 0 days.

(21) Appl. No.: 09/285,509

(22) Filed: Apr. 2, 1999

(51) Int. Cl.$^7$ ........................................ G01J 1/00
(52) U.S. Cl. ................................ 250/495.1; 250/494.1
(58) Field of Search .............................. 250/495.1, 493.1, 250/494.1

(56) References Cited

U.S. PATENT DOCUMENTS

| | | | |
|---|---|---|---|
| 4,684,801 | * 8/1987 | Carroll et al. | 250/221 |
| 4,859,080 | * 8/1989 | Titus et al. | 250/495.1 |
| 5,548,120 | * 8/1996 | Parker et al. | 250/495.5 |
| 5,600,148 | 2/1997 | Cole et al. | 250/495.1 |

OTHER PUBLICATIONS

Cole, B. et al., "512 + 512 WISP (Wide Band Infrared Scene Projector) Arrays", SPIE vol. 2741, pp. 81–93, Orlando, FL (1996).

Cole, B. et al., "Recent Progress in Large Dynamic Resistor Arrays", SPIE vol. 3084, pp. 58–70, Orlando, FL (1997).

Pritchard, A.P. et al., "Current Status of the British Aerospace Resistor Array IR Scene Projector Technology", SPIE vol. 3084, pp. 71–77, Orlando, FL (1997).

Allen, Phillip E. et al., "CMOS Analog Circuit Design", Holt, Rinehart and Winston, pp. 227, 240–241, New York (1987).

\* cited by examiner

*Primary Examiner*—Bruce C. Anderson
(74) *Attorney, Agent, or Firm*—Skjerven, Morrill & MacPherson LLP; David E. Steuber

(57) ABSTRACT

A dual sample-and-hold architecture in each unit cell of a read-in-integrated-circuit (RIIC) provides maximum frame rate without frame overlap. Analog pixel signals are updated sequentially in one sample-and-hold capacitor, while an emitter element displays a pixel of a display frame in response to a stored analog signal voltage on an isolated second sample-and-hold capacitor. After all unit cells are updated, the signals on the two capacitors are combined, updating all emitter elements for the next frame. A voltage mode amplifier as an emitter driver provides a more nearly linear dependence of infrared power output on signal voltage than do previous transconductance amplifiers. A digital to analog converter (DAC) on the RIIC substrate results in a simplified interface to the RIIC and in an increased immunity to noise. A constant current source in the unit cell provides constant power dissipation and temperature, independent from variations in emitter element current, improving stability and scene dependent crosstalk. Emitter element current returns to an external ground plane through semiconductor substrate contacts for all unit cells. This configuration eliminates metal interconnects, which produce scene-dependent voltage drops in the return circuit, adversely affecting linearity and crosstalk.

42 Claims, 11 Drawing Sheets

CONSTANT POWER SNAPSHOT MICROEMITTER ARRAY WITH INTEGRAL DIGITAL INTERFACE, ISOLATED SUBSTRATE CURRENT RETURN, AND LINEARIZED SIGNAL RESPONSE

FIELD OF THE INVENTION

This invention relates to resistively heated microemitter arrays, particularly to the incorporation of sample-and-hold, and snapshot circuitry into read-in-integrated-circuits (RIICS) for use with microemitter arrays.

BACKGROUND

Infrared (IR) scene generation is presently a critical technology for testing of IR imaging systems, for example in IR-guided missile systems. By artificially generating a changing IR scene and projecting it into the IR sensing system of a missile, the various performance elements of the missile can evaluated in a laboratory setting, reducing the need for costly missile test firings. This same IR scene generation technology is also being adapted for portable field testing of missiles and FLIR (Forward Looking InfraRed) systems.

Two-dimensional arrays of resistively heated microemitter elements are one type of device used to create and display infrared scenes. A microemitter element is generally a small two-terminal thin film resistor, that is deposited onto a thin silicon nitride or silicon dioxide substrate, that is supported from a base structure by thermally insulating legs or posts that also typically provide electrical connections to supply current to the element. Fabrication typically employs micromachining technology.

To simulate an entire IR scene, it is desirable to integrate the microemitter elements into a two-dimensional array. For adequate resolution, the array typically contains at least 512 elements in each of the x and y dimensions. FIG. 1A is a perspective view illustrating for clarity a 3×3 array segment 100 of microemitter elements 102. For this configuration, two electrical connections 104 are provided to each element. For example, an array segment 100 of 3×3=9 elements 102 requires eighteen electrical connections 104. Extrapolating the 3×3 array example to an array of 512×512 elements would produce a requirement for 524,288 electrical connections.

Emitted infrared power increases monotonically with increasing temperature. An electrical current through a specific emitter element 102 determines its temperature and therefore the infrared power that it emits. A single element 102 thus provides a single pixel (spatial resolution element) of an IR scene. By performing this process with every individual element 102 in an array, an infrared scene is generated pixel by pixel. The scene can then be updated at high speed to simulate a moving target that can be viewed by a remote IR imaging system.

A typical 512×512 microemitter array measures on the order of 30 mm on a side. Each emitter element 102 typically measures tens of microns on a side and has a dynamic range of several hundreds of degrees C. The temperature of the emitter element is proportional (to first order) to the power dissipated in the element. Therefore emitter element temperature has the same relationship as does the emitter element power dissipation to applied signal voltage. To attain the needed output temperature range, the range of currents supplied to an emitter element must be capable of changing dynamically by more than four orders of magnitude.

After the applied current is removed, a resistive emitter element cools by radiation and by heat conduction and/or convection through a surrounding gas atmosphere and/or mechanical support structure. The time constant for heating and cooling is typically a few msec, and can be selected by specifying the mass (heat capacity) of the emitter and the thermal conductance of the structure and surroundings.

To facilitate the required multiple electrical connections to emitter elements 102, a read-in-integrated-circuit (RIIC) 106 is employed. This integrated circuit provides electronic timing and output signals to the emitter array, as well as electric interconnects and support structure for each emitter element 102. RIIC 106 typically employs CMOS technology, and includes signal multiplexing, control, and power circuitry (see for example Cole et al., "512×512 WISP (Wide Band Infrared Scene Projector) Arrays," SPIE vol. 2741, Orlando, Fla., 1996, p. 83).

As shown in FIG. 1A, emitter elements 102 are supported on RIIC 106 by thermally insulating legs, which also provide electrical connections 104 to the resistor body 108 (large central thin film deposition) of emitter element 102. Emitted IR radiation is shown by arrows 110 from a representative resistor body 108. Slots between adjacent emitter elements 102 minimize thermal crosstalk (i.e., pixel signal distortion caused by interelement heat conduction). Electrical connectors 104 can contact RIIC 106 directly or can contact supporting structures attached to that substrate (see Cole et al., U.S. Pat. No. 5,600,148, Issued Feb. 4, 1997).

It is desired for RIIC 106 to provide a unique signal voltage specific to each emitter element 102, thus causing each element to emit a unique and controlled amount of IR radiation. This element-specific interface circuitry is contained in a portion of RIIC 106 called a unit cell 112. For a large array of emitter elements 102, each supporting unit cell 112 typically is physically located directly beneath its respective emitter element 102.

FIG. 1B is a simplified block diagram of the major circuitry blocks associated with conventional RIIC 106. Analog signal data are received at an analog signal interface 140, and are distributed by an analog signal multiplexer 148 through column interconnect lines 114 to individual unit cells 112 as addressed by a column multiplexer 142 and a row multiplexer 144. Unit cells 112 are configured in a two-dimensional array of unit cells 150. Typically, analog signal interface 140 can consist of 32 or more parallel analog input lines, and analog signal multiplexer 148 can consist of 32 or more parallel multiplexers, each associated with one of a plurality of off-RIIC digital-to-analog converters (not shown).

FIG. 1C is a simplified schematic block diagram of the conventional RIIC circuitry of FIG. 1B, showing an expanded view of two unit cells 112, 113. Unit cells 112, 113 are configured identically and are located in the same column but in differing rows in array of unit cells 150. In the architecture illustrated, analog signal interface 140 includes 32 parallel signal input lines. Column multiplexer 142 addresses analog signal multiplexer 148, causing analog pixel data to load onto 32 parallel column interconnect lines 114. Then row multiplexer 144 provides an address signal on a row enable line 124, which momentarily closes a sample-and-hold switch 120, charging a sample-and-hold capacitor 116 to a signal voltage V1 in 32 representative unit cells 112 in a selected row. An appropriate combination of column multiplexers 142 and row multiplexers 144 provide addressing for other unit cells 112 in RIIC 106. Again, according to conventional system architecture, no more than 32 unit cells can be addressed simultaneously.

Sample-and-hold capacitor 116 in the 32 representative unit cells 112 of the selected row is connected between a circuit ground node 130 and an input terminal of a transconductance amplifier 126. The output terminal of transconductance amplifier 126 is connected to resistor body 108 of emitter element 102 through electrical connection 104. Thus voltage V1 on sample-and-hold capacitor 116 will give rise to a corresponding current 132 from transconductance amplifier 126 through emitter element 102, heating the emitter element and generating infrared radiation (see FIG. 1A). Current 132 will remain steady until the next row enable signal refreshes the charge on sample-and-hold capacitor 116 in the next frame cycle.

Prior emitter arrays that have been used for IR scene generation have updated their display information one line or a portion of a line at a time. A number of organizations (see for example Cole et al., SPIE 1996, cited above; Cole et al., "Recent Progress In Large Dynamic Resistor Arrays," SPIE vol. 3084, Orlando, Fla., 1997, p. 59; and Pritchard et al., "Current Status of the British Aerospace Resistor Array IR Scene Projector Technology," SPIE vol. 3084, Orlando, Fla., 1997, p. 73) have produced resistive emitter arrays. All of these arrays exhibit a problem of frame overlap inherent in display architectures that update one line at a time. This frame overlap means that at high frame rates, part of the display is showing an old frame, while the rest of the display is being updated with a new frame. This problem can create anomalous output, such as the display of the same simulated fast moving target in two distinct locations at the same time on the emitter array.

Traditionally, the only way that these prior arrays can be used without the potential for frame overlap is to provide a "dead" time, during which no new data are sent to the emitter array. During this dead time, the remote imaging system under test must completely sample the image. The minimum dead time must be at least as long as the integration time of the imaging system under test. The maximum usable frame rate for the emitter array is then determined by the sum of the integration time of the imaging system under test and the minimum time required to completely update a new frame.

As an example, a microemitter array with a 100 frame per second update rate (i.e., 10 ms per frame) being used with an imaging system under test that has a 2 ms integration time can display frames no faster than one every 12 ms (83 Hz frame rate) without incurring frame overlap problems. Providing a "dead time" has the further disadvantages of requiring the imaging system under test to stop sensing or to discard data during the "dead time." This is generally unacceptable for an imaging system under test.

Another drawback of existing microemitter arrays is a nonlinearity of IR output as a function of signal voltage input. A fourth order relationship to input voltage has been reported (see Cole et al. SPIE 1997, cited above, pp. 63–65). This results in a highly nonuniform minimum displayable temperature difference (MDTD) or temperature step resolution corresponding to the least significant bits (LSBs) of the input datastream, depending on the magnitude of the signal within the dynamic range. Improved MDTD uniformity is needed.

Prior RIIC designs have required off-RIIC multiple parallel digital-to-analog converters, or DACs (32 or more for a 512×512 pixel RIIC) to achieve desired 16 bit accuracy at a needed minimum display rate of 120 Hz or more (see for example Cole et al. SPIE 1997, cited above, p. 59). Poor performance resulting from multiple DACs have prompted some organizations to forego all on-chip multiplexing of drive signals, opting instead for individual off-RIIC drivers for all 512 display lines (see Pritchard et al., SPIE 1997, cited above, p. 73). Improved digital-to-analog conversion is clearly needed.

Other resistive emitter arrays (see for example Cole et al. SPIE 1997, cited above, and Pritchard et al., SPIE 1997, cited above) suffer from local output dependent voltage variations in the return path for the emitter current. These voltage variations result from element-to-element differences in the emitter current that are the result of changes in the projected IR scene. Thus the specific voltage across an emitter and its output signal are dependent on the output level of neighboring pixels. This results in crosstalk (interelement pixel signal distortion) among neighboring emitter elements.

Crosstalk that results when current return contacts in nearby unit cells have less resistance between each other than to their common connection to an off-IC ground is well documented in the literature on resistive emitter arrays. Previous methods to solve the problem of output dependent emitter crosstalk fall into two categories: effect reduction and effect compensation. Attempts to reduce the effect consist of laying out internal multilayer metal "ground paths in both the x and y directions, so any radiance changes occur gradually in both directions" (see Cole et al. SPIE 1997, cited above). Because of this, the return path for current from different unit cells in an emitter array would be longer or shorter depending on the cell location in the array. However, even for a steady state scene, there are voltage differences for internal IC grounding depending on the location of the unit cell and the impedance of the line. Supporters of this approach have indicated that future development would include an additional metal layer to enhance grounding.

Compensation attempts consist of analyzing the emitter input signals line by line and then reducing or augmenting the drive signal to each emitter to correct in advance for scene dependent crosstalk.

SUMMARY

A dual sample-and-hold architecture in each unit cell of a read-in-integrated-circuit (RIIC) allows maximum frame rate without frame overlap. Each unit cell contains two capacitors, a sample-and-hold capacitor and a snapshot capacitor. Analog pixel signals are updated sequentially in a first sample-and-hold capacitor, during the same time period in which an emitter element displays a pixel of a display frame in response to a stored analog signal voltage on an isolated second sample-and-hold capacitor. At the end of a frame time, after all unit cells are updated sequentially, a FRAME LOAD timing signal initiates a global enable signal that momentarily closes a switch between first and second sample-and-hold capacitors for all unit cells. This allows the signals on the two sample-and-hold capacitors to combine, thereby updating all emitter elements for the next display frame.

The emitter element is interconnected to the second sample-and-hold capacitor through an emitter driver. Configuring the emitter driver as a voltage-mode amplifier (generating a voltage output in response to a voltage input) provides the advantage of more nearly linear power dissipation in the emitter element in response to the stored analog signal voltage on the second sample-and-hold capacitor. Nonlinearity is approximately second order (quadratic) with a voltage mode amplifier, whereas response with previous transconductance amplifiers (generating a current output in response to a voltage input) is typically nonlinear to the fourth order.

Analog pixel signals are delivered to the respective unit cells sequentially through an analog data line connected to the output of a digital-to-analog converter (DAC). In some embodiments, the DAC is incorporated onto the same semiconductor substrate as the unit cell and the other elements of the RIIC. This results in a simplified interface to the RIIC and in an increased immunity to noise.

In some embodiments, the unit cell is configured to include a constant current source. This constant current source typically includes two appropriately biased p-channel transistors. One of the transistors supplies constant current, which is conducted as a heating current through the emitter element and as a difference current. The difference current represents the difference between the current supplied by the current source and the current flowing through the heating element. This configuration maintains a substantially constant overall current in the unit cell, thereby providing a constant power dissipation in the unit cell, independent from variations in emitter element current. Accordingly, the scene dependent crosstalk and the thermal stability of the entire system are substantially improved.

In some embodiments, the current through the emitter element returns to an external ground plane through semiconductor substrate contacts. The external ground plane serves as a common ground terminal for all unit cells. Each individual emitter element current return circuit is contacted through a p+ substrate contact, and is isolated from other emitter element return circuits by surrounding n-wells. The current path then passes through a series of doped epitaxial and bulk silicon layers to the external ground plane. This configuration eliminates any metal interconnects, which otherwise produce scene-dependent I×R voltage drops in the return circuit, that adversely affect crosstalk.

The present invention is better understood upon consideration of the detailed description below, in conjunction with the accompanying drawings.

BRIEF DESCRIPTION OF THE DRAWINGS

The present invention may be better understood, and its numerous objects, features, and advantages made apparent by referencing the accompanying drawings. For simplicity and ease of understanding, common numbering of elements within the illustrations is employed where an element is the same in different drawings.

DETAILED DESCRIPTION

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the scope of the present invention. Hence, these descriptions and drawings are not to be considered in a limiting sense, as it is understood that the present invention is in no way limited to the embodiments illustrated.

The incorporation of an additional sample-and-hold stage into the unit cells of read-in-integrated circuits (RIICs) for use with resistively heated microemitter arrays allows the entire display of a microemitter array to be updated substantially simultaneously. An RIIC or a microemitter array employing this architecture is referred to as a snapshot RIIC or a snapshot emitter array, respectively, by analogy with a photographic snapshot.

Figure 2A:
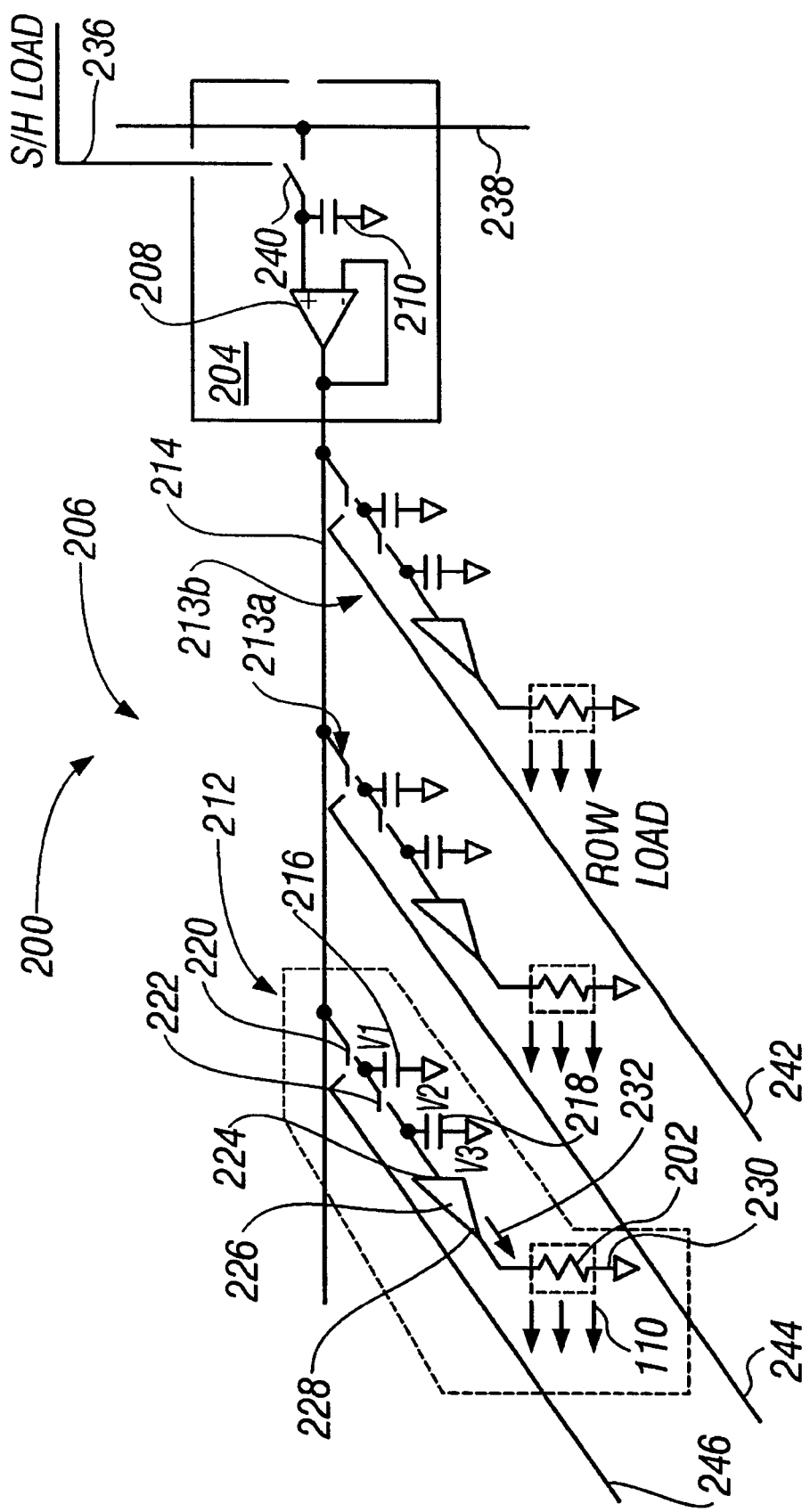
FIG. 2A is a simplified schematic diagram of a portion of the circuitry in a snapshot RIIC for a snapshot emitter array, according to the present invention.

FIG. 2A is a simplified schematic diagram of three unit cells of a single column in a snapshot RIIC 206 for a snapshot emitter array 200, according to the present invention. Unit cells 212, 213a, and 213b are all similarly configured and are electrically connected to a column interconnect line 214. Column interconnect line 214 provides the signal interface for all unit cells located along one column of snapshot emitter array 200 and provides an associated column amplifier 208 in series with a column sample-and-hold capacitor 210 for that column. Column sample-and-hold capacitor 210 is interconnected with an analog data line 238 through column sample-and-hold switch 240. For convenience, column sample-and-hold switch 240, column sample-and-hold capacitor 210, and column amplifier 208 are grouped within a sample-and-hold buffer cell block 204, along with corresponding elements for the other columns of snapshot RIIC 206.

A sample-and-hold capacitor 216 in each unit cell is interconnected with column interconnect line 214 through a sample-and-hold switch 220 and with a snapshot capacitor 218 through a snapshot switch 222. Snapshot capacitor 218 is connected to an input terminal 224 of an emitter driver 226. A resistive emitter element 202 is connected between an output terminal 228 of emitter driver 226 and a circuit ground terminal 230.

Figure 3A:
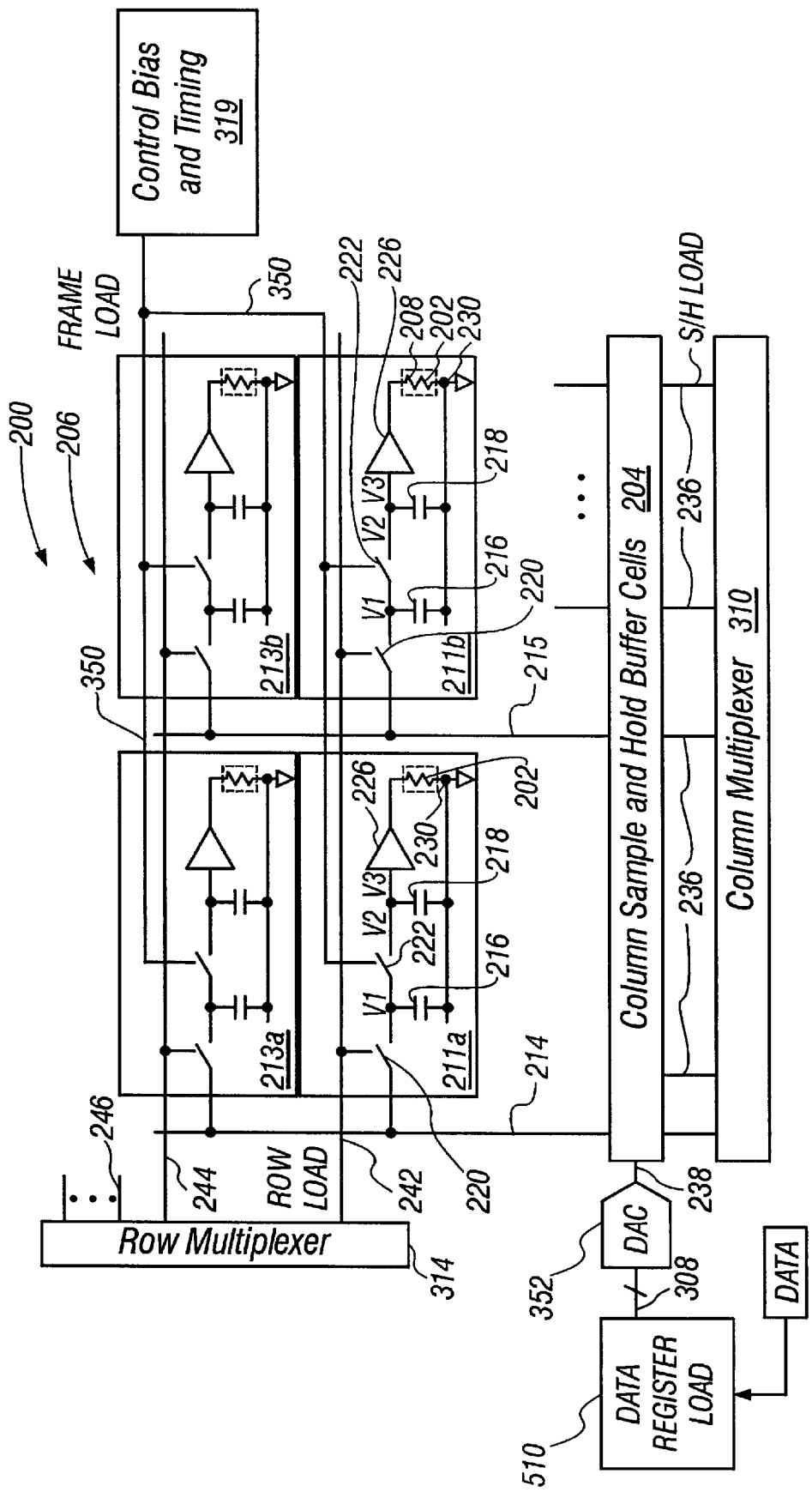
FIG. 3A is a block diagram of major circuitry blocks associated with a snapshot RIIC.

FIG. 3A is a block diagram of the major circuitry blocks associated with snapshot RIIC 206, showing four unit cells in two columns and two rows. In addition to previously described circuitry, FIG. 3A shows a RIIC control bias and timing block 319, a column multiplexer 310, and a row multiplexer 314. Multiplexers 310 and 314 generate respective column enable and row enable output signals in response to input timing signals from system clock circuitry, to be described below in more detail. RIIC control bias and timing block 319 provides reference biases, current references, and timing signals in response to off-chip timing pulses for snapshot RIIC 206.

Four representative unit cells 211a, 211b, 213a, 213b are connected such that unit cells 211a and 213a are connected in different rows to column interconnect line 214, and unit cells 211b and 213b are similarly connected in different rows to a second column interconnect line 215. Column sample-and-hold capacitors 210, switches 240, and amplifiers 208 (not individually shown) are all grouped within sample-and-hold buffer cell block 204.

Figure 2B:
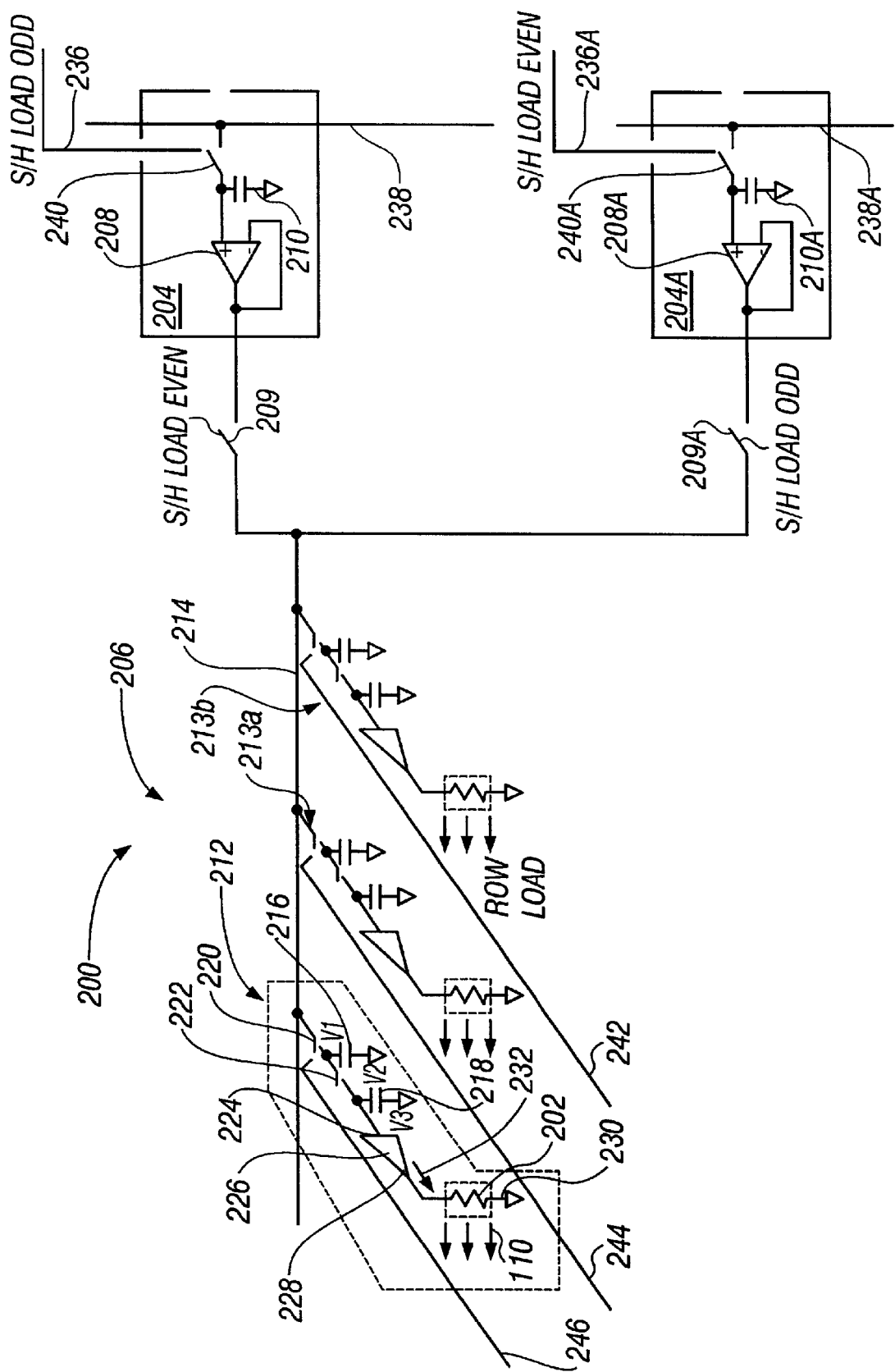
FIG. 2B is a simplified schematic diagram similar to FIG. 2A with a dual sample-and-hold buffer architecture.
Figure 3B:
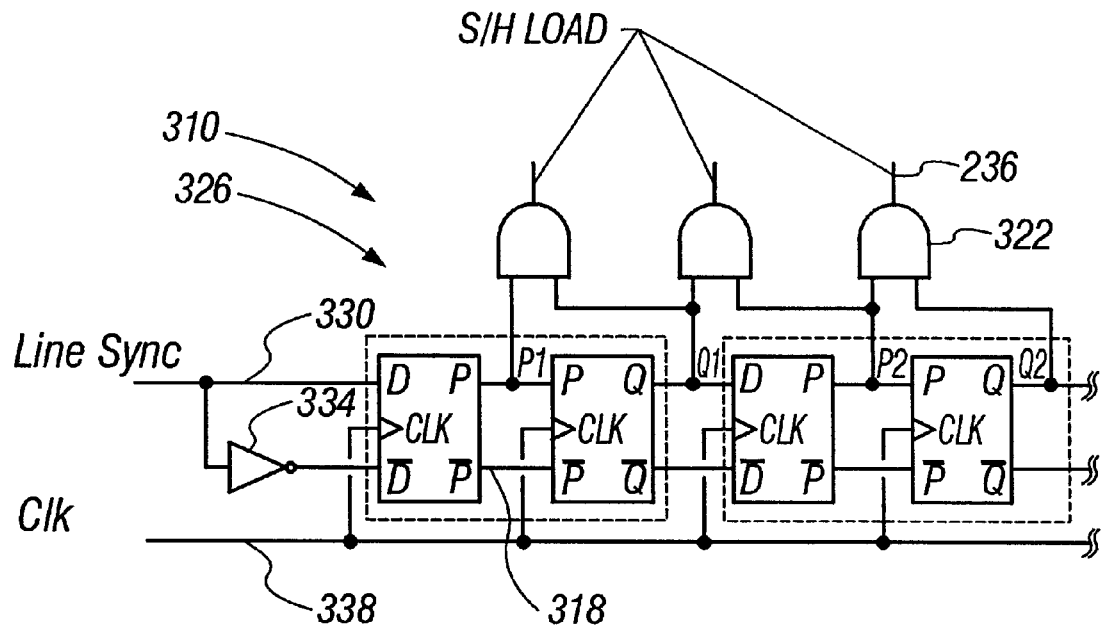
FIGS. 3B and 3C are schematic diagrams of major circuitry for a column multiplexer 310 and a row multiplexer.
Figure 3C:
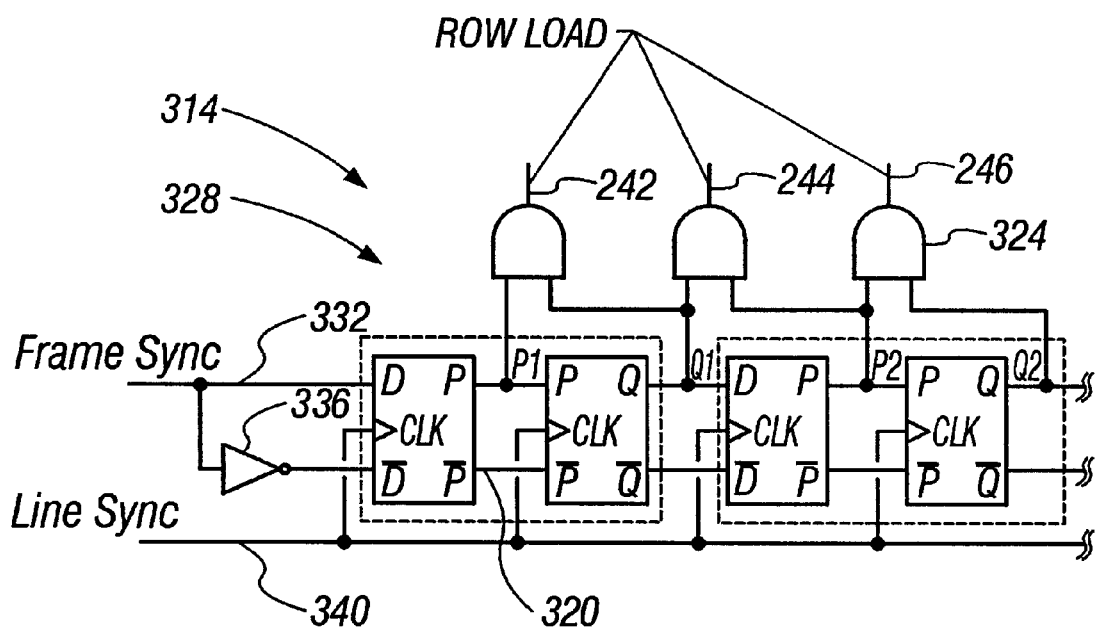

FIGS. 3B and 3C are schematic diagrams of major circuitry for column multiplexer 310 and row multiplexer 314, respectively. These multiplexers each include a series of d-flip-flops 318, 320 respectively configured as a column shift register 326 and a row shift register 328. Input terminals of AND gates 322, 324 respectively are connected to respective column and row d-flip-flops 318, 320. An output terminal of each column AND gate 322 is connected to a column enable line, for example line 236, and the output terminal of row AND gate 324 is connected to a row enable line, for example lines 242, 244, 246 (see also FIGS. 2 and 3A). Logic input lines 330 and 332 are connected to the D terminal of first d-flip-flops 318 and 320 respectively, and through inverters 334 and 336 to the respective $\overline{D}$ inverted input terminals. Timing input lines 338 and 340 are bussed to CLK terminals of all d-flip-flops 318, 320 of column multiplexer 310 and row multiplexer 314 respectively.

In some embodiments, the circuit elements of snapshot RIIC 206 are active or passive devices familiar in the art, and can be fabricated onto a single semiconductor chip using well-known integrated circuit technology. Amplifiers and emitter drivers 208 and 226, for example, can be n-channel transistors configured as source follower amplifiers, and switches 220, 222, and 240 can likewise be n-channel transistors. In other embodiments, other devices and circuit configurations are employed, as described in more detail below.

Figure 4A:
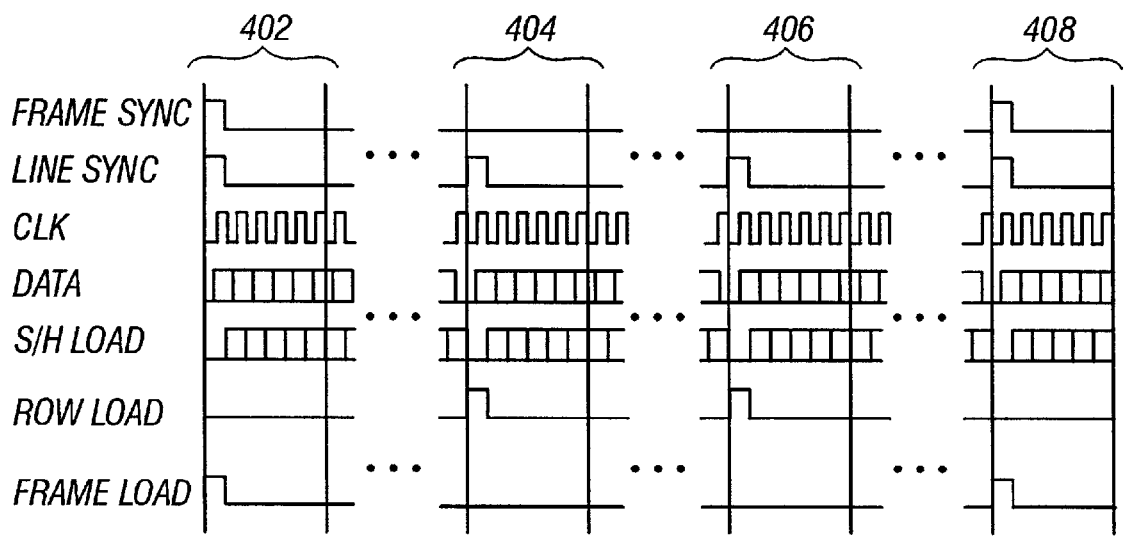
FIG. 4A is a timing diagram illustrating the operation of frame sample timing.

FIG. 4A is a timing diagram illustrating the operation of frame sample timing. Timing signals FRAME SYNC, LINE SYNC, CLK are typically supplied by off-chip system components, described in more detail below, to snapshot RIIC 206. Digital data, representing a stream of pixel signals, are supplied by an off-chip computer system (not shown) to a digital data interface 308 through a digital data register load module 354 (see also FIGS. 3A–3C). For column multiplexer 310, timing signals LINE SYNC and CLK are applied to logic input line 330 and to timing input line 338 respectively, to input a starting pulse to column shift register 326 and subsequently to shift that pulse along the register. AND gates 322 are used to provide an address pulse S/H LOAD to each column sequentially through column enable lines 236. Similarly, FRAME SYNC and LINE SYNC timing signals are applied respectively to logic input line 332 and timing input line 340 of row shift register 328, to provide row address pulses ROW LOAD through row enable lines, for example lines 242, 244, 246.

In a first timing interval 402, for each clock cycle CLK, a new digital pixel signal value is advanced in response to a DATA timing signal to the output of data register load module 510 (which is part of the system interface) and is then digital-to-analog converted in DAC 352 and sampled into a first column sample-and-hold capacitor 210 (see FIG. 2A) at S/H LOAD. At a second timing interval 404, a new LINE SYNC pulse is generated at the start of a row, and a new row from the array of unit cells 212 samples and holds the existing buffered column sample-and-hold signal values at timing signal ROW LOAD through row enable lines 242, 244, 246. This process updates the analog pixel signal on sample-and-hold capacitor 216 for array of unit cells 212 row by row, as illustrated at a third timing interval 406, until every capacitor 216 in the entire the array of unit cells 212 has been updated with analog pixel signals. At the start of a fourth timing interval 408, a FRAME LOAD timing signal is generated by control bias and timing module 319 in response to a FRAME SYNC timing signal. FRAME SYNC is delivered through snapshot enable lines 350, closing snapshot switches 222 of all unit cells 212 substantially simultaneously, thereby enabling a charge share between capacitors 216 and 218 of each unit cell substantially simultaneously and updating the entire emitter array image for the next display frame. FRAME SYNC timing signal also resets other RIIC timing circuits for the next display frame. As discussed herein, the term "simultaneous" refers to events that are generally initiated by a single timing signal. In ordinary electronic circuitry such events can, however, be separated in time by intervals typically ranging from tens of nanoseconds to tens of microseconds, depending on signal delays and propagation times.

In more detail, for each half cycle of CLK pulse, a new analog pixel signal V1 is generated on analog data line 238 by DAC 352. Column multiplexer 310 addresses a new column enable line 236, thereby momentarily closing a next column sample-and-hold switch 240. This samples analog pixel signal V1 on analog data line 238 into a next column sample-and-hold capacitor 210. Column amplifier 208 drives this analog pixel signal V1 onto column interconnect line 214. The next half CLK timing signal causes column multiplexer 310 to shift to the next column address, and the cycle repeats until each column interconnect line 214 is updated with its unique analog pixel signal V1 value.

When all column interconnect lines 214 have been updated, a ROW LOAD signal is issued, causing row multiplexer 314 to address a new row enable line, for example line 242, 244, or 246. This applies a gate enable voltage, which momentarily closes all unit cell sample-and-hold switches 220 in the new addressed row substantially simultaneously, thus charging each sample-and-hold capacitor 216 of the respective row to a next analog pixel signal V1 value unique to the column interconnect line 214 for each respective unit call 212. Only one sample-and-hold switch 220 for one unit cell 212 is closed momentarily at any given time on any one column interconnect line 214. The above timing sequence is repeated, until all analog pixel signal V1 values are updated sequentially on the sample-and-hold capacitor 216 in each unit cell of snapshot RIIC 206. While V1 has been used to represent the voltage on line 238, sample-and-hold capacitor 210, line 214 and capacitor 216, it will be understood that in practice the voltage at these locations could differ because of an offset in column amplifier 208, charge pumping in sample-and-hold capacitor 210, etc.

At the end of the above timing sequence, a FRAME LOAD signal is issued. This applies a gate enable signal from RIIC control bias and timing block 319 through a snapshot enable line 350 connected to all unit cells 212 (see FIG. 3A) to momentarily close the snapshot switch 222 in each unit cell of the entire snapshot RIIC 206 substantially simultaneously. This accordingly causes the charge stored on sample-and-hold capacitor 216 to be combined with the residual charge on snapshot capacitor 218 in each unit cell 212 substantially simultaneously, and thus updates entire snapshot emitter array 200 for the next display frame. During display of the previous display frame by snapshot emitter array 200, as described in more detail below, the entire timing sequence described above is repeated, thereby sequentially updating analog pixel signals V1 for a new display frame on all unit cell sample-and-hold capacitors 216 in snapshot RIIC 206.

Figure 4B:
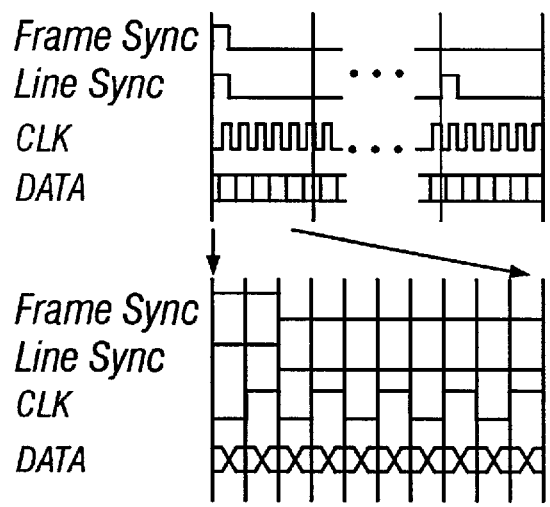
FIGS. 4B and 4C are timing diagrams detailing the operation of system control clocks.
Figure 4C:
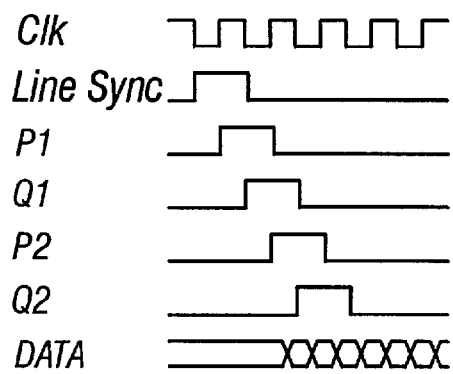

FIGS. 4B and 4C are timing diagrams detailing the operation of system control clocks. FIG. 4B is a timing diagram illustrating the operation of system control clocks to snapshot RIIC 206. In the upper portion of FIG. 4B, the timing signals FRAME SYNC, LINE SYNC, CLK used to synchronize the frame, line and DATA load timing are illustrated for a first line and for a representative subsequent line of a display frame. The lower portion of FIG. 4B illustrates these same timing signals on an expanded time scale near the start of a new frame time. A FRAME SYNC pulse is generated at the start of each new frame time. A LINE SYNC pulse is generated, when the analog pixel signals V1 are to be loaded into unit cells 212 in a new row (line) of snapshot RIIC 206. A CLK pulse is generated repetitively throughout the operation of RIIC 206. At each half cycle of a CLK pulse, a DATA signal phase-delayed by 90 degrees relative to a rising or falling edge of the CLK pulse samples a new analog pixel signal from analog data line 238 into column sample-and-hold buffer cells 204.

FIG. 4C is a timing diagram illustrating in more detail the timing for column multiplexer 310 and column sample-and-hold 210 stages. CLK pulses are generated repetitively, as described above, and are applied substantially simultaneously to the CLK terminals of column multiplexer 310 through timing input line 338, as illustrated in FIG. 3B. At the start of a line (row), a LINE SYNC pulse is applied through logic input line 330 uninverted to terminal D and is applied inverted through inverter 334 to inverted terminal $\overline{D}$ of the first d-flip-flop 318. Timing pulses P1, Q1, P2, Q2, . . . , Pn, Qn, used to address column enable lines 236 through AND gates 322, are generated sequentially by shift register 326 in response to initiating LINE SYNC pulse and repetitive CLK pulses. As shown in FIG. 4C, P1 and Q1 are true until the second rising edge of CLK. At this time the analog value output on analog data line 238 is sampled at first column sample-and-hold capacitor 210. Subsequent column sample-and-hold stages are addressed and sampled in a similar fashion.

Referring to FIGS. 2 and 3A, when sample-and-hold switch 220 is closed, column amplifier 208 charges capacitor 216 through column interconnect line 214 to analog pixel signal V1 voltage. Opening switch 220 isolates analog pixel signal V1 to be sampled and held on sample-and-hold capacitor 216. This process allows sample-and-hold capacitors 216, for each row of unit cells 212, to be updated sequentially with analog pixel signals for a next frame during frame display of previously stored analog signal voltages V2 on snapshot capacitors 218. At the beginning of each new frame time, after analog pixel signal voltages V1 for all unit cell sample-and-hold capacitors 216 have been sequentially updated from column amplifier 208 during the previous frame time and all sample-and-hold switches 220 are open, snapshot switch 222 closes for all unit cells 212 substantially simultaneously. This process causes a charge corresponding to analog pixel signal V1 on sample-and-hold capacitor 216 to be combined with a charge corresponding to a residual voltage V2 on adjacent snapshot capacitor 218. Then snapshot switch 222 opens again, isolating a stored analog signal voltage V3, resulting from charge combining, on snapshot capacitor 218.

Sample-and-hold capacitor 216 is preferably larger than snapshot capacitor 218, typically by a factor of 5 or more, in unit cell 212. This minimizes the contribution from any existing charge and corresponding residual voltage V2 on capacitor 218 to the shared charge and corresponding stored analog signal voltage V3 in the snapshot display frame update. Thus the charge share is dominated by the charge corresponding to analog pixel signal V1 on capacitor 216. Due to the configuration and operation of the circuitry of unit cell 212, errors associated with the charge share between capacitors 216 and 218 can be calculated in advance and minimized by adjusting the update analog pixel signal V1 value supplied by column amplifier 208.

For a given unit cell 212, the above calculation is typically performed in a system data processor, described below in more detail, by applying the following mathematical expression:

$$V1=[V3(C216+C218)-V2(C218)]/(C216),$$

where:
V1 is the next frame unit cell analog sample-and-hold signal voltage;
V2 is the previous frame unit cell snapshot capacitor signal voltage;
V3 is the next frame unit cell snapshot capacitor signal voltage; and
C216 and C218 are the respective capacitances of unit cell capacitors 216 and 218.

Because snapshot switches 222 close substantially simultaneously (typically within about 1 $\mu$sec) in all unit cells 212, the IR output signal levels for all emitter elements 202 are updated substantially simultaneously, resulting in a total display frame snapshot refresh. Referring to FIG. 2A, emitter driver 226 delivers a current 232 through emitter heating element 202, determined by the value of stored analog signal voltage V3, resulting in heating of the emitter element and emission of an IR output signal, during the same time interval in which sample-and-hold capacitor 216 is being updated for the next frame time.

Figure 1A:
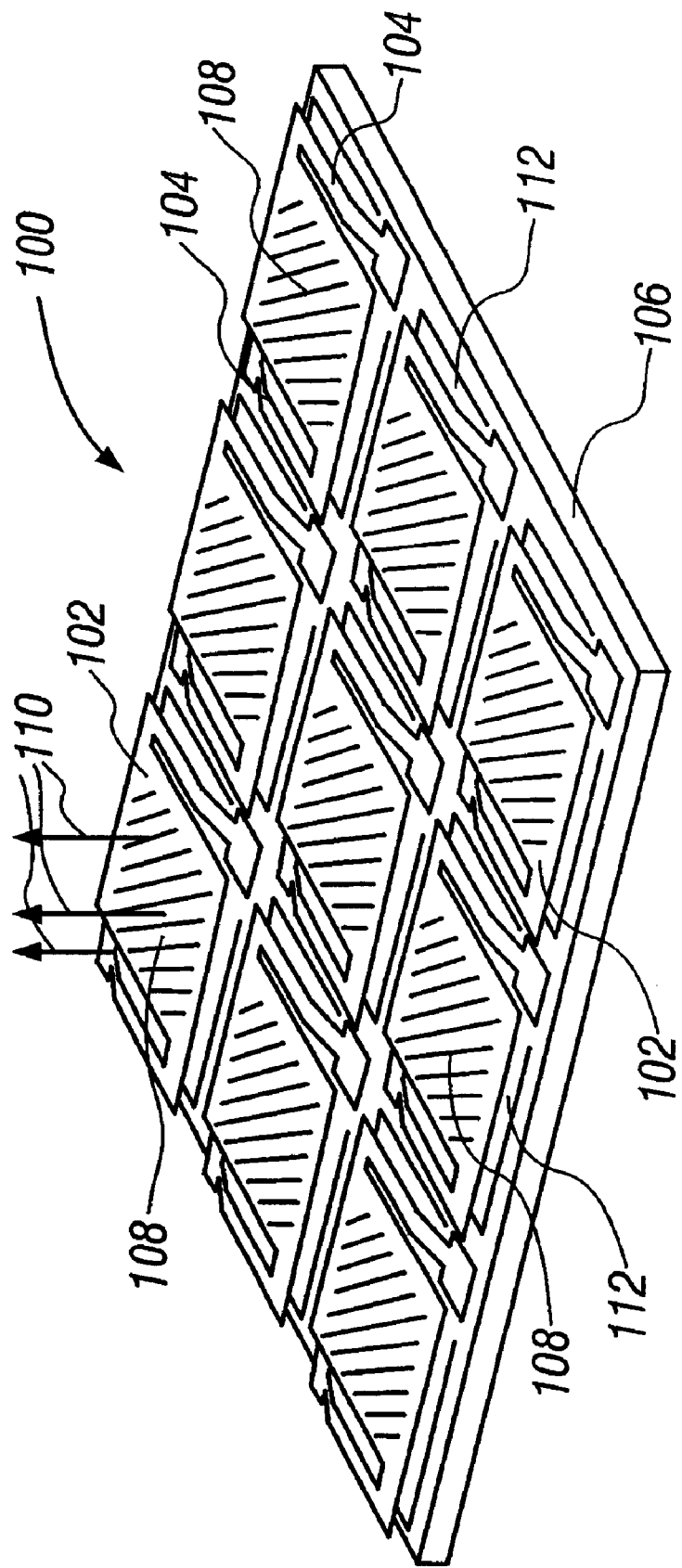
FIG. 1A is a perspective view illustrating a 3×3 array segment of microemitter elements.
Figure 1C:
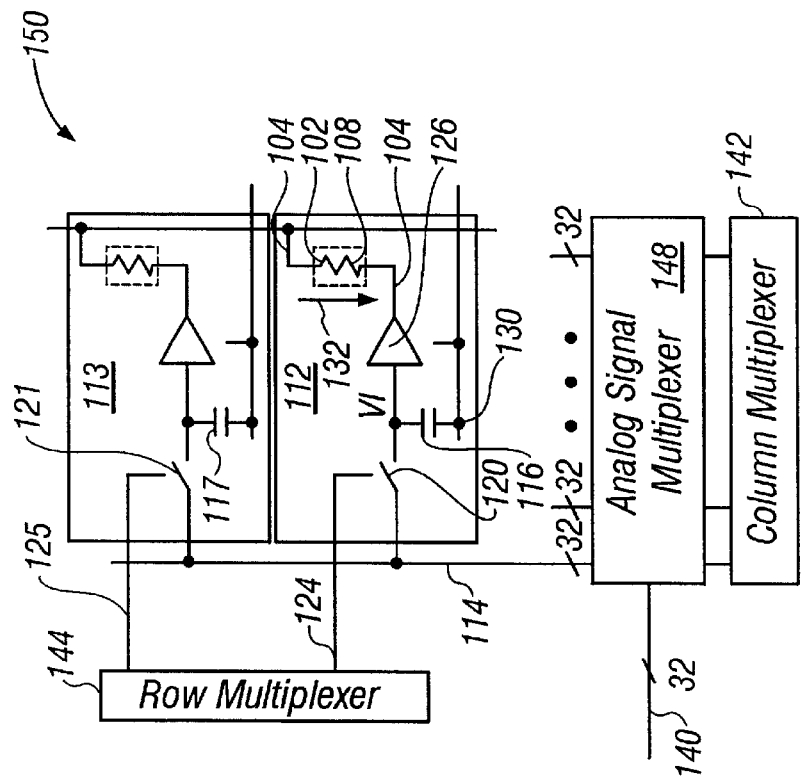
FIG. 1C is a simplified schematic block diagram of the conventional RIIC circuitry of FIG. 1B, showing an expanded view of two unit cells.
Figure 1B:
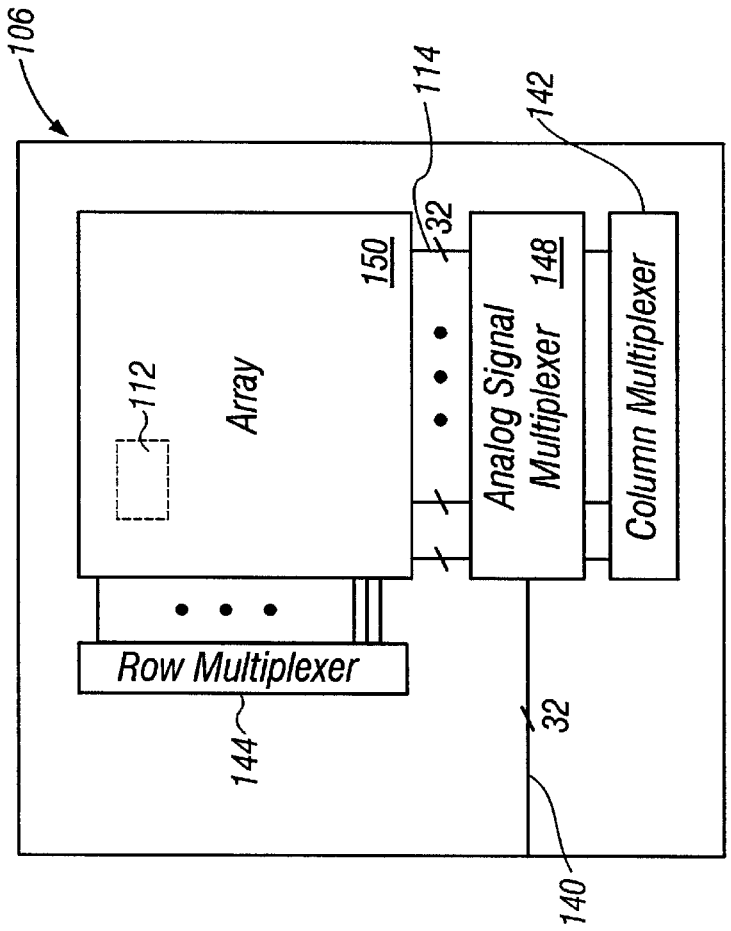
FIG. 1B is a simplified block diagram of the major circuitry blocks associated with a conventional RIIC.

FIG. 1C illustrates a conventional emitter driver 126 in a transconductance amplifier configuration (generating an output current in response to an input voltage), as in prior emitter RIICs. FIGS. 2 and 3A depict emitter driver 226 configured as a voltage mode amplifier (generating an output voltage in response to an input voltage), either as a source follower buffer or with voltage gain, according to embodiments of the present invention. Previously employed transconductance amplification using CMOS technology results in power dissipated across an emitter element 202 that is proportional to the fourth order (fourth power) of stored analog signal voltage V3. By contrast, voltage mode amplification results in quadratic (second order) dependence of power dissipation on stored analog signal voltage V3. These dependencies result from well-known properties of CMOS devices. Further, if power dissipation $P=kV^2$, where V is stored analog signal voltage and k is an arbitrary constant of proportionality, then the rate of change of power dissipation as a function of stored analog signal voltage is $dP/dv=2$ kV, which is a linear function.

Use of a voltage-mode amplifier configuration for emitter driver 226 provides emitter element temperatures more nearly linearly dependent on stored analog signal voltages. Minimum temperature steps between the least significant bits (LSBs) in the source digital datastream are less dependent on the magnitude of the signal within the dynamic range. Thus, the minimum displayable temperature difference (MDTD) or temperature resolution is more nearly uniform across the range. In prior drive methods in which power dissipation has a fourth order dependence on stored analog signal voltage, the MDTD is highly nonuniform over the dynamic range, such that too many bits are used to define lower end temperature intervals and too few bits are available to define higher end temperature intervals.

Figure 5A:
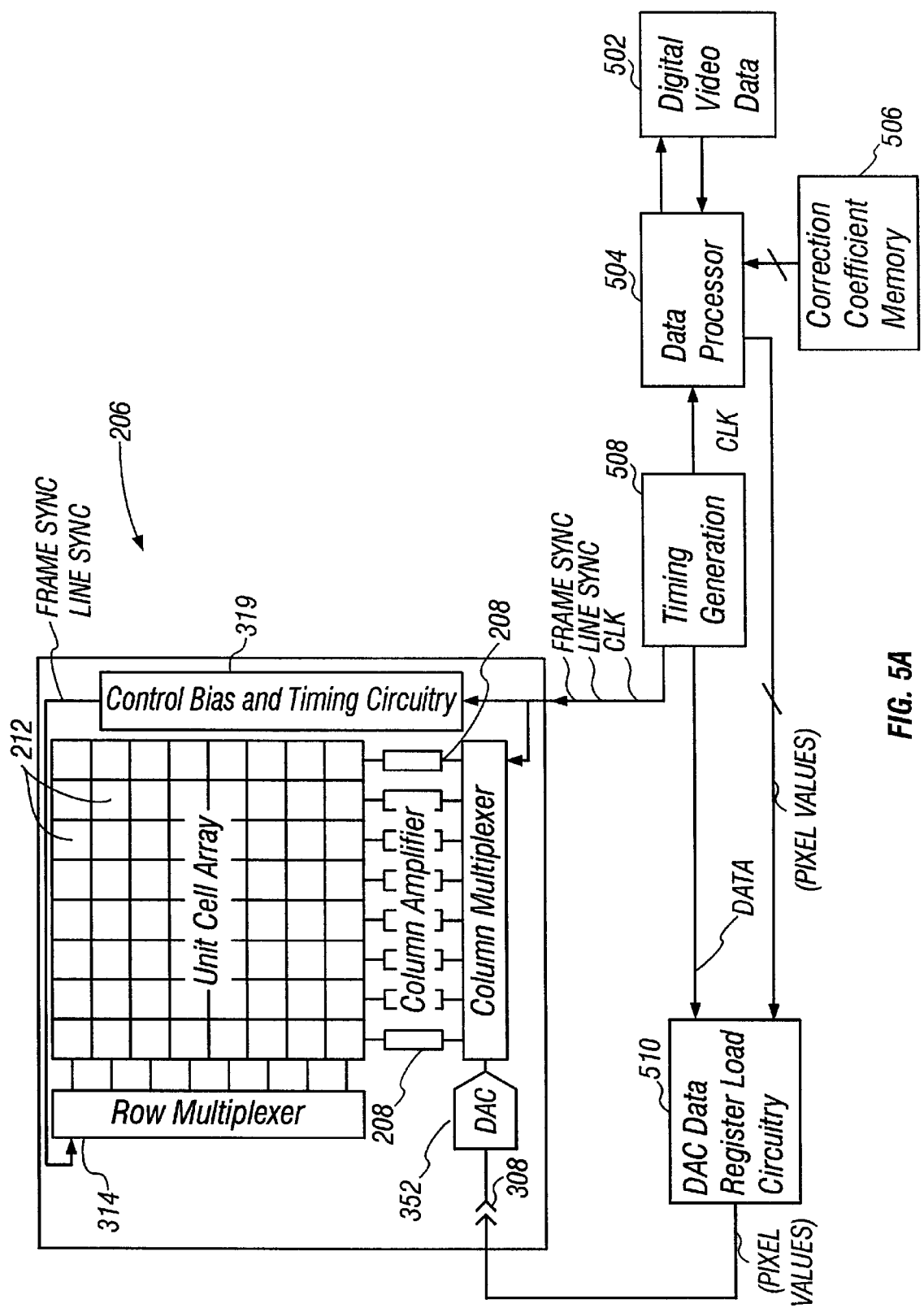
FIG. 5A is a schematic diagram showing a snapshot RIIC and its interface to a system.

FIG. 5A is a schematic diagram showing snapshot RIIC 206 and its interface to a display system 500. A digital video data memory 502 contains the digital signal information for each element of each frame to be displayed. Nonuniformities in RIIC and emitter responses, as well as frame-to-frame unit cell capacitor voltage errors as described above, require compensation. This is provided by digital processing of the digital signal values for each pixel of each display frame prior to data load into RIIC 206. This operation is performed in a system data processor 504, which utilizes correction coefficients stored in a coefficient memory 506, to process the digital pixel data, for example to perform the mathematical calculation described above, prior to loading the data into RIIC 206. A timing generator 508 provides synchronizing CLK signals to system data processor 504, DATA timing signals to a digital data register load module 510, and FRAME SYNC, LINE SYNC, and CLK timing signals to RIIC control bias and timing block 319.

In some embodiments, DAC 352 is incorporated into snapshot RIIC 206. Prior RIICs for use with resistive emitter arrays receive scene data as analog voltage levels. These prior devices require many (32 or more) off-chip DACs to convert the source digital scene data from a system computer into analog voltages for emitter elements 202 (see for example Cole et al. SPIE 1997, cited above, p. 59). In accordance with the present invention, digital data are transmitted directly from digital data register load module 510 to on-chip high speed DAC 352 in snapshot RIIC 206 through on-chip digital data interface 308. This configuration simplifies external electronics, and increases noise immunity and display speed. The number of DACs (conventionally 32 or more) can also be reduced, because the DAC output analog pixel signals are driven a shorter distance when DAC 352 is integral to snapshot RIIC 206. As an example, a 512×512 emitter element RIIC chip having integral DACs has a maximum display speed of roughly 200 Hz and requires only two DACs.

Figure 5B:
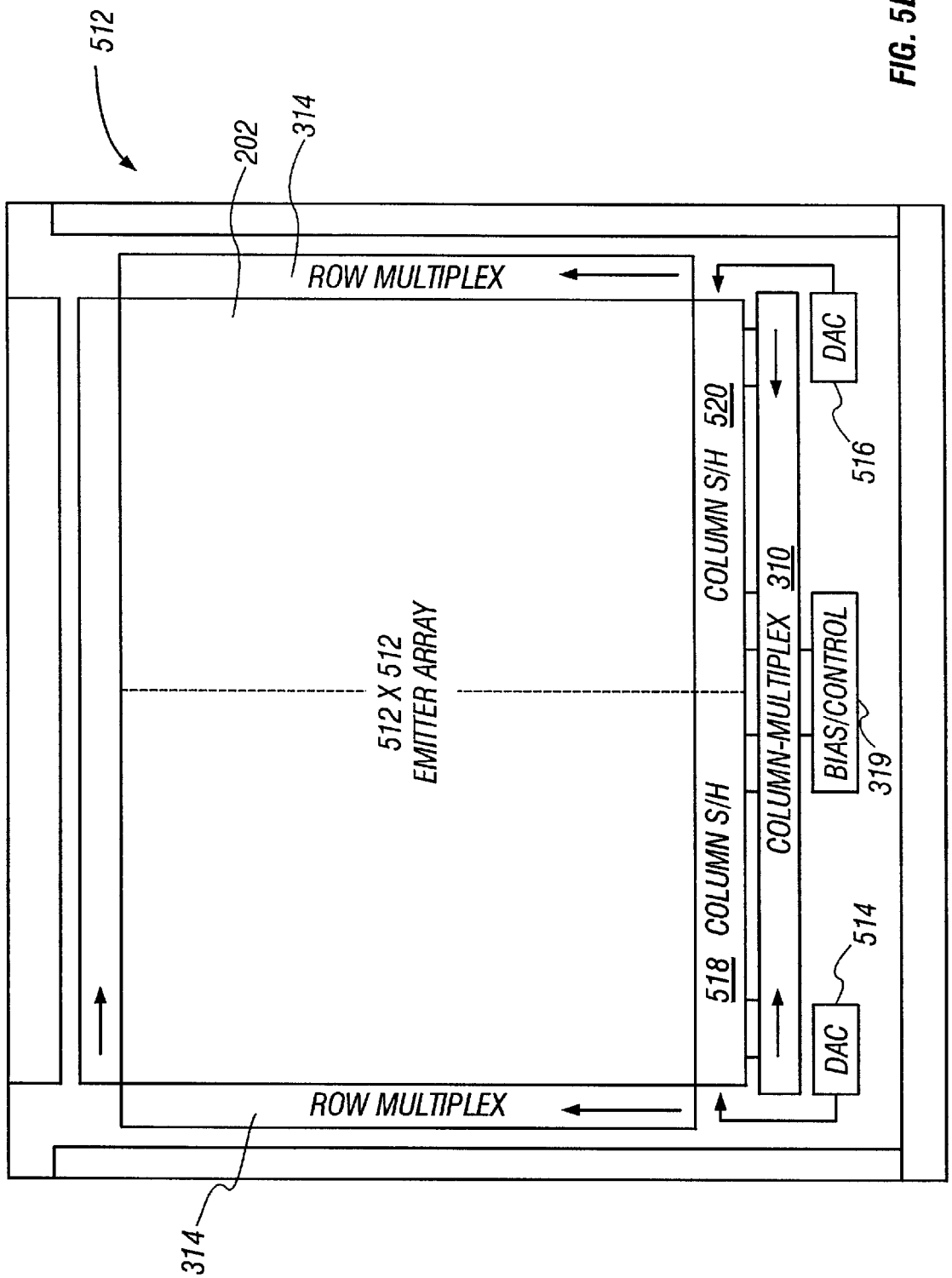
FIG. 5B is a schematic plan view of a 512×512 RIIC device, according to an embodiment of the present invention.

FIG. 5B is a schematic plan view of a 512×512 RIIC device 512, for example a 512×512 emitter array RIIC device made by Indigo Systems Corporation, 5385 Hollister Avenue, Santa Barbara, Calif. 93111, according to an embodiment of the present invention. RIIC device 512 has two parallel DAC circuits 514, 516, shown left and right respectively, which provide a higher overall digital data interface rate than a single DAC circuit to RIIC device 512.

Additionally, a dual column sample-and-hold buffer architecture, as shown in FIG. 2B, is employed. The embodiment of FIG. 2B is similar to the embodiment of FIG. 2A except that a second sample-and-hold buffer cell block 204A is included with sample-and-hold buffer cell block 204. Switches 240 and 240A operate as a multiplexer such that the voltage on analog data line 238 is delivered alternately to sample-and-hold buffer cell blocks 204 and 204A, respectively. Switches 209 and 209A also operate as a multiplexer to deliver the outputs of column amplifiers 208 and 208A to column interconnect line 214 in succession. The control signal S/H LOAD ODD controls switches 240 and 209A, and the control signal S/H LOAD EVEN controls switches 240A and 209.

Thus, during a first time interval, for example, switch 240 is closed, allowing the voltage from analog data line 238 to pass to sample-and-hold capacitor 210, while switch 209A is closed, allowing the output of buffer amplifier 208A to pass to column interconnect line 214. Switches 209 and 240A are open, isolating the voltage on analog data line from sample-and-hold capacitor 210A and the output from buffer amplifier 208 from column interconnect line 214, respectively. During a second time interval switch 240A is closed, allowing the voltage from analog data line 238 to pass to sample-and-hold capacitor 210A, while switch 209 is closed, allowing the output of buffer amplifier 208 to pass to column interconnect line 214. Switches 209A and 240 are open, isolating the voltage on analog data line from sample-and-hold capacitor 210 and the output from buffer amplifier 208A from column interconnect line 214, respectively.

Referring again to FIG. 2A, a circuit ground node 230 provides a circuit ground reference for capacitors 216 and 218 and connects unit cell 212 with a return current path for current flowing through emitter element 202. Traditionally, a return current for unit cell 212 flows to an external ground plane through metal lines or layers in RIIC 206. These conducting paths run laterally relative to the plane of the emitter array and interconnect multiple rows and columns of unit cells. According to Ohm's law, a current I through a metal line of resistance R creates a voltage drop in the line equal to the product of I×R. Thus, the voltage at node 230 in any unit cell 212 is offset from ground by an amount proportional to the return current from all unit cells interconnected together, and accordingly is scene dependent. Cell-to-cell variations in voltage at node 230 directly manifest themselves as errors in the voltage across emitter element 202. This in turn introduces crosstalk and output signal errors between cells that share a current return path.

Figure 6:
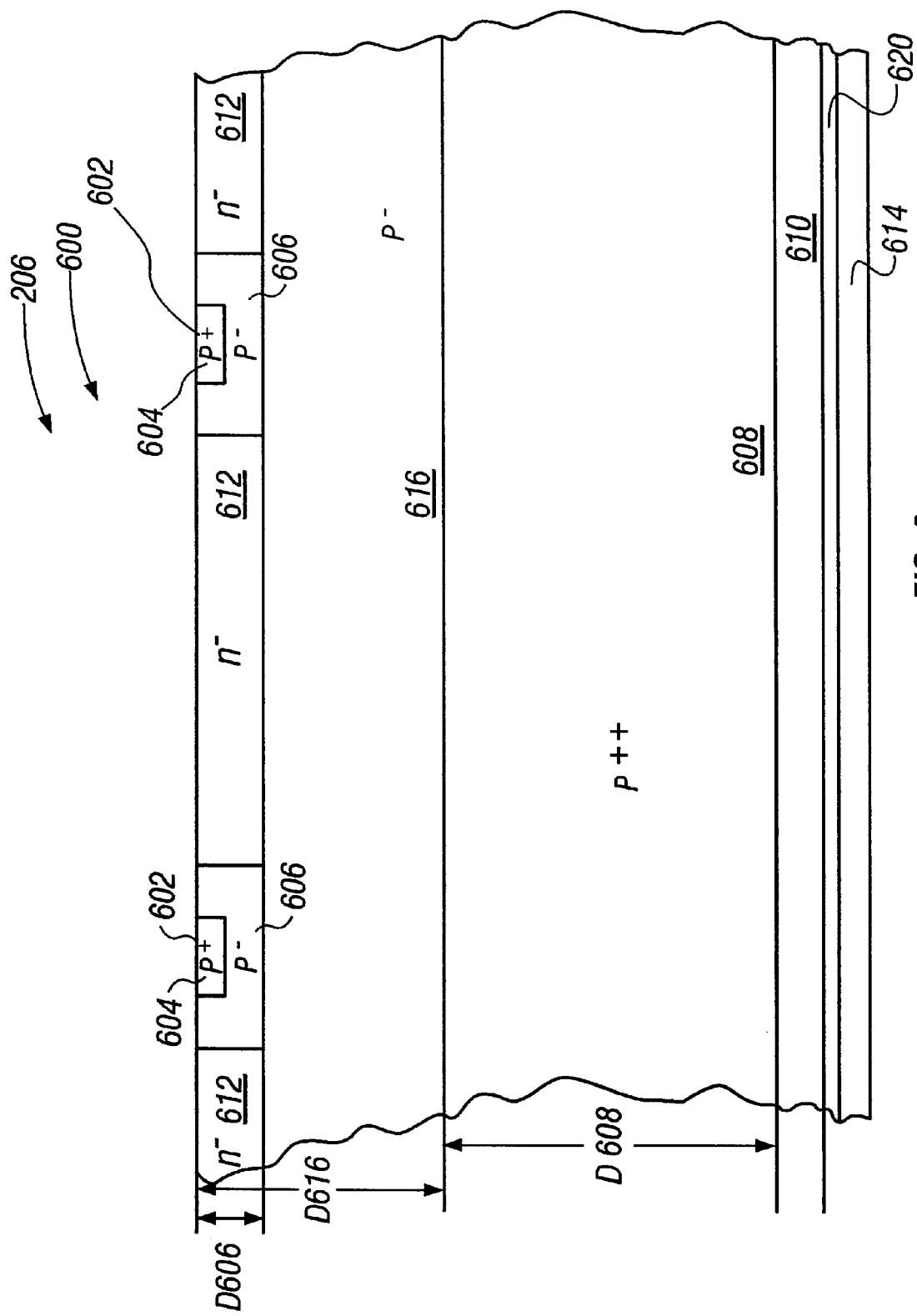
FIG. 6 is a cross-sectional view of an isolated semiconductor substrate contact configuration, according to an embodiment of the present invention.

FIG. 6 is a cross-sectional view of an isolated semiconductor substrate contact configuration 600, according to the present invention. Isolated semiconductor substrate contacts provide a return path for emitter element heating current to a ground plane that is electrically connected to the RIIC substrate. Return current from emitter element 202 passes through ground node 230 for each individual unit cell 212. Instead of passing laterally through metal interconnects, as in previous RIIC configurations, return currents from emitter elements 202 of individual unit cells 212 are kept isolated from one another and are conducted individually through electrical connections 104 (see FIG. 1A) and short metal lines, vias and contacts (not shown) to ground nodes 230 of unit cells 212, which independently connect to semiconductor substrate contacts 602. Substrate contacts 602 for each unit cell 212 are connected individually to a p+ contact region 604 in a p-well 606 doped to a resistivity of approximately 0.3 ohm-cm. Current paths for individual unit cells 212 are further isolated from one another by surrounding each p-well 606 with an n-well 612. From p-well 606, return current from each unit cell 212 flows in a substantially downward direction through a substantially uniform p-epi layer 616, doped to a resistivity of approximately 15 ohm-cm. From there, the return current passes through bulk silicon substrate 608, having degenerate $p^{++}$ doping with a resistivity of roughly 0.01 ohm-cm, to an internal ground layer 610, forming a lower surface of substrate 608. Substrate 608 typically has a layer thickness D608 on the order of 612 microns. P-epi layer 616 has a thickness D616 on the order of 13 microns. A contact/well region 606, 612 in p-epi layer 616 containing contact areas 604, p-wells 606, and n-wells 612 has a thickness D606 on the order of 3 microns.

Contact between a deposited metal layer 610 and an external ground plane 614, which provides a common ground terminal for all unit cells 212, is established by soldering the entire respective surfaces together with a solder layer 620. Instead of solder, a conductive epoxy could be used. Total resistance along this return current path has been measured to be roughly 650 ohms per contact 602. Because external ground plane 614 runs parallel to substrate 608, the current return path for each unit cell 212 has a uniform distance of approximately 625 microns through material that provides approximately the same resistivity for each unit cell.

Isolated semiconductor substrate contact configuration 600 provides the benefit of substantially uniform current return paths for all unit cells 212 and frees up metal layers in the RIIC to be used for other purposes. The semiconductor substrate acts as the only common current return path to the ground plane, substantially eliminating scene dependent crosstalk without the need for active compensation. Although relatively minor error effects occur between neighboring unit cells, these crosstalk effects are localized and are not propagated down columns or across rows as they would be for metal lateral current returns.

Since an emitter element typically covers less than 50% of the substrate area below it, the substrate also generates an infrared output signal that depends on substrate temperature. The problem of emitter substrate temperature stability has not previously been specifically addressed. Others have suggested approaches for heat removal from the emitter array, but have not described any method of active temperature control or compensation (see Cole et al. SPIE 1997, cited above, and Pritchard et al., SPIE 1997, cited above). However, the degree of temperature stability achievable with any active temperature control method can at best only approach the stability of a system that dissipates uniform power. Constant current circuitry, described below in more detail, substantially eliminates output dependent crosstalk at its source by removing scene dependent nonuniform current draw, and is thus fundamentally different from approaches suggested by others.

By maintaining a substantially constant current through each emitter unit cell, the total power dissipation of the emitter array remains nearly constant and uniform. Without constant current circuitry, power dissipation in the emitter array is nonuniform, dependent on the IR scene being generated. Nonuniform power dissipation results in substrate temperature fluctuations that adversely affect the ultimate accuracy of an emitter system.

Figure 7:
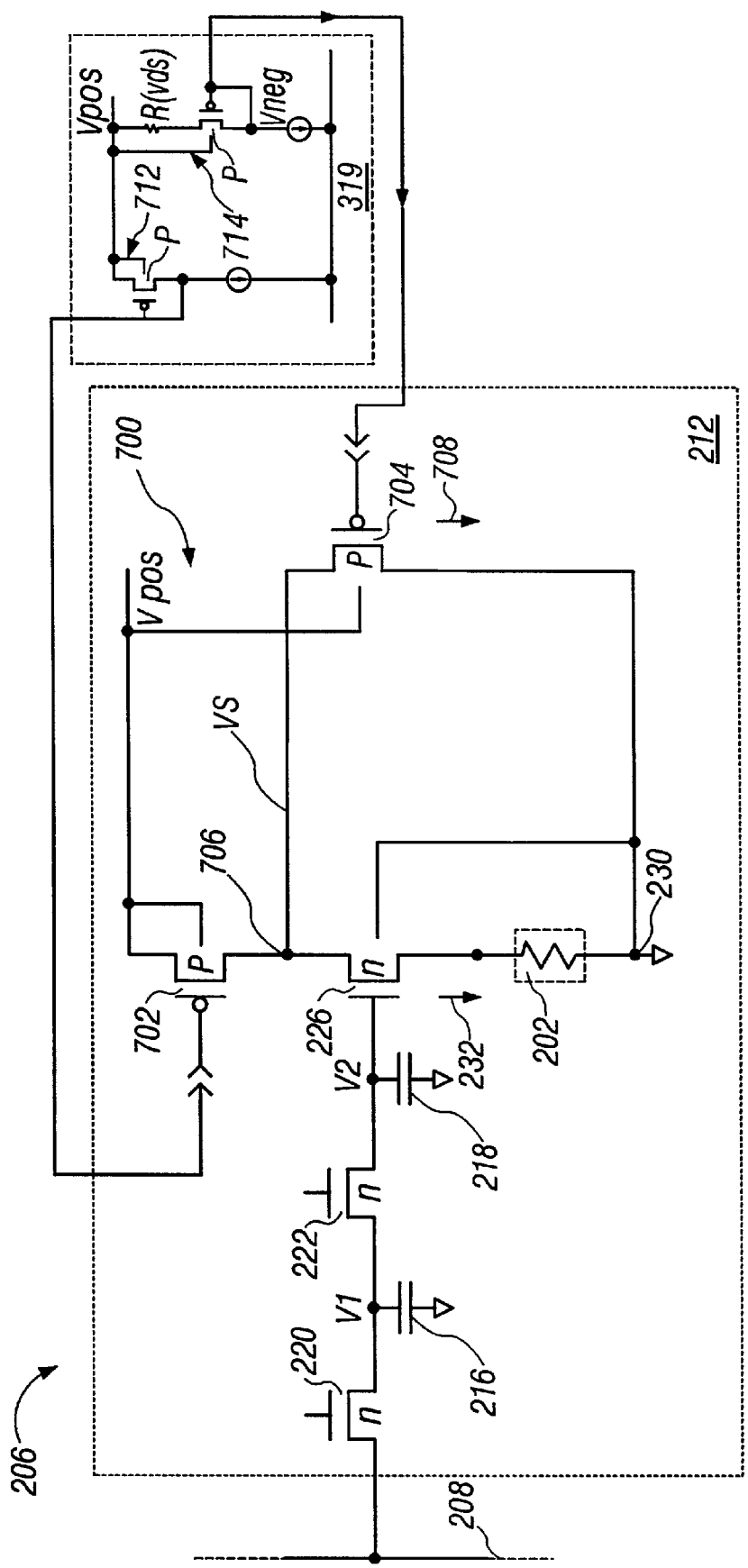
FIG. 7 is a schematic diagram showing a constant current control circuit in a unit cell.

FIG. 7 is a schematic diagram showing a constant current control circuit 700 in unit cell 212. A p-channel transistor 702 has its drain connected to the drain of emitter driver n-channel transistor 226 and its source connected to a voltage supply VPOS. P-channel transistor 702 is configured as a current source, which determines the total current conducted through each unit cell 212, independent from the current 232 drawn through emitter element 202. To accomplish this, the current from p-channel transistor 702 is biased to a level above the maximum current required to heat emitter element 202. A second p-channel transistor 704 is biased, such that its source voltage VS still maintains p-channel transistor 702 in saturation, while conducting the full current from p-channel transistor 702. Constant current control circuit 700 provides a substantially constant current for each unit cell, independent from variations in current 232 through emitter element 202. RIIC 206 thus dissipates substantially uniform and constant power, thereby simplifying the system interface and thermal stabilization for emitter array 200 and RIIC 206.

Operation of constant current control circuit 700 for a unit cell 212 over various operating conditions is illustrated by the following examples. In a first example, stored analog signal voltage V3 on snapshot capacitor 218 provides a gate bias to emitter driver n-channel transistor 226. This produces a follower voltage at the source of n-channel transistor 226 that is more positive than circuit ground node 230, thereby applying a voltage across emitter element 202. From Ohms Law (I=E/R) current 232 through emitter element 202 is equal to the voltage applied across emitter element 202 divided by the resistance of emitter element 202. As the drain node 706 of emitter driver n-channel transistor 226 has a high impedance on the order of 100 kohms or greater, the excess current, or a difference current 708, supplied by p-channel transistor 702 pulls drain node 706 of emitter driver n-channel transistor 226 positive. As drain node 706 is connected to the source of p-channel transistor 704, this process increases gate-to-source voltage VGS for p-channel transistor 704. As the source for p-channel transistor 704 increases in voltage, difference current 708 supplied by p-channel transistor 702 is conducted through p-channel transistor 704 and bypasses emitter element 202.

In a second example, a zero volt bias is applied across emitter element 202, and thus no current flows through the emitter element. All current supplied by p-channel transistor 702 is then conducted through p-channel transistor 704 bypassing emitter element 202.

The gate of p-channel transistor 702 for all unit cells 212 is biased on-chip by a current reference bias generator circuit 712, located in RIIC control bias and timing block 319. Similarly, the gate of p-channel transistor 704 for all unit cells 212 is biased on-chip by a bias generator circuit 714, located likewise in RIIC control bias and timing block 319, that is set to maintain an adequate voltage VDS across p-channel transistor 702. The detailed design and operation of such bias circuits is described in standard circuit design texts (see for example P. E. Allen and D. R. Holberg, "CMOS Analog Circuit Design," Holt, Rinehart and Winston, New York, 1987, pp. 227, 240–241).

By maintaining a constant current in each unit cell 212 (independent of the scene being displayed), scene dependent voltage variation in the return current and associated crosstalk are substantially eliminated. The current supplied by current source transistor 702 can be made significantly greater than the maximum current required by emitter element 202, in which case any error in the current supplied by transistor 702 would have no effect on the current through emitter element 202 and instead would be reflected in the difference current flowing through transistor 704.

The dual sample-and-hold capability of unit cell 212 allows snapshot mode operation, wherein signals supplied to all emitter elements 202 are updated substantially simultaneously (typically within about 1 $\mu$sec), once per frame time. While one frame is displayed, snapshot array RIIC 206 collects emitter drive voltages on individual sample-and-hold capacitors 216 for the next frame. By updating all emitter elements 202 substantially simultaneously in a snapshot, there is never any frame overlap in snapshot emitter array 200.

Existing conventional emitter arrays and their associated RIIC devices cannot support snapshot operation, as described above. These conventional devices include only a single sample-and-hold capacitor per unit cell, thereby precluding any possibility to update a unit cell sample-and-hold stage independently from applying signals to the emitter elements. Unlike conventional line update emitter arrays, in accordance with the present invention there is never a need to insert dead time after a display frame update. Consequently a snapshot emitter array 200 can always be operated at its fastest update rate, limited only by the thermal constant of the emitter element and the speed of the imaging system under test.

While embodiments of the present invention have been shown and described, changes and modifications to these illustrative embodiments can be made without departing from the present invention in its broader aspects. Thus it should be evident that there are other embodiments of this invention which, while not expressly described above, are within the scope of the present invention. Therefore, it will be understood that the appended claims necessarily encompass all such changes and modifications as fall within the described invention's true scope; and further that this scope is not limited merely to the illustrative embodiments presented to demonstrate that scope.

What is claimed is:

1. A method of displaying a dynamic infrared image from a two-dimensional array of electrically resistive infrared emitter elements, comprising the acts of:

generating a first electrical current in response to a corresponding stored analog signal voltage at each said emitter element;

passing each said first electrical current through a corresponding emitter element to an electrical ground terminal during a first frame time;

dissipating an electrical power in response to said first electrical current in said emitter element, such that said emitter element emits a pixel of a first display frame of said infrared image; and updating said stored analog signal voltage, such that said analog signal voltages for all of said emitter elements of said two-dimensional array are updated together within a time duration less than said first frame time.

2. The method of claim 1, wherein said electrical power dissipated in said emitter element is substantially proportional to the second power of said corresponding stored analog signal voltage.

3. The method of claim 1, further comprising the act of providing a difference electrical current bypassing said emitter element, such that the sum of said first electrical current and said difference electrical current is substantially constant, independent of said first electrical current.

4. The method of claim 1, further comprising the act of passing said first electrical current from each of said emitter elements independently to said electrical ground terminal through a doped semiconductor layer.

5. The method of claim 1, wherein the act of updating said stored analog signal voltage further comprises the act of converting a digital datastream to a stream of said analog pixel signals, said converting occurring on a semiconductor substrate supporting said emitter element.

6. The method of claim 1, wherein said analog signal voltage is coupled with said emitter elements through a read-in-integrated-circuit.

7. The method of claim 1, wherein the act of updating said stored analog signal voltage further comprises the acts of:

delivering an analog pixel signal at each of said emitter elements sequentially during said first frame time until said analog pixel signals have been delivered to all of said emitter elements, during which first frame time each of said analog pixel signals remains electrically isolated from the corresponding stored analog signal voltage for each of said emitter elements; and combining each of said analog pixel signals into said corresponding stored analog signal voltage within a time period of less than said first frame time for all of said emitter elements of said two-dimensional array, thereby substantially simultaneously updating all of said stored analog signal voltages.

8. The method of claim 7, wherein said combining for all of said emitter elements occurs substantially simultaneously.

9. The method of claim 7, wherein said combining for all of said emitter elements occurs within a time less than 10 microseconds.

10. The method of claim 1, wherein all of said emitter elements are updated substantially simultaneously.

11. The method of claim 1, wherein all of said emitter elements are updated within a time less than 10 microseconds.

12. A method of displaying a dynamic infrared image from a two-dimensional array of electrically resistive infrared emitter elements, comprising the acts of:

generating a first electrical current in response to a corresponding stored analog signal voltage at each said emitter element;

passing each said first electrical current through a corresponding emitter element to an electrical ground terminal during a first frame time;

dissipating an electrical power in response to said first electrical current in said emitter element, said electrical power being substantially proportional to the second power of said corresponding stored analog signal voltage, such that said emitter element emits a pixel of a first display frame of said infrared image; and updating said stored analog signal voltage with an analog pixel signal.

13. The method of claim 12, further comprising the act of providing a difference electrical current bypassing said emitter element, such that the sum of said first electrical current and said difference electrical current is substantially constant, independent of said first electrical current.

14. The method of claim 12, further comprising the act of passing said first electrical current from each of said emitter elements independently to said electrical ground terminal through a doped semiconductor layer.

15. The method of claim 12, wherein the act of updating said stored analog signal voltage further comprises the act of converting a digital datastream to a stream of said analog pixel signals, said converting occurring on a semiconductor substrate supporting said emitter element.

16. The method of claim 12, wherein said analog signal voltage is coupled with said emitter element through a read-in-integrated-circuit.

17. A method of displaying a dynamic infrared image from a two-dimensional array of electrically resistive infrared emitter elements, comprising the acts of:

generating a first electrical current in response to a stored analog signal voltage at each said emitter element;

passing each said first electrical current through a corresponding emitter element to an electrical ground terminal during a first frame time;

providing a difference electrical current bypassing said emitter element, such that the sum of said first electrical current and said difference electrical current is substantially constant, independent of said first electrical current;

dissipating an electrical power in response to said first electrical current in said emitter element, such that said emitter element emits a pixel of a first display frame of said infrared image; and updating said stored analog signal voltage with an analog pixel signal.

18. The method of claim 17, further comprising the act of passing said first electrical current from each of said emitter elements independently to said electrical ground terminal through a doped semiconductor layer.

19. The method of claim 17, wherein the act of updating said stored analog signal voltage further comprises the act of converting a digital datastream to a stream of said analog pixel signals, said converting occurring on a semiconductor substrate supporting said emitter element.

20. The method of claim 17, wherein said analog signal voltage is coupled with said emitter element through a read-in-integrated-circuit.

21. A method of displaying a dynamic infrared image from a two-dimensional array of electrically resistive infrared emitter elements, comprising the acts of:

generating a first electrical current in response to a corresponding stored analog signal voltage at each emitter element;

passing each said first electrical current through a corresponding emitter element to an electrical ground terminal through a doped semiconductor layer during a first frame time;

dissipating an electrical power in response to said first electrical current in said emitter element, such that said emitter element emits a pixel of a first display frame of said infrared image; and updating said stored analog signal voltage with an analog pixel signal.

22. The method of claim 21, wherein the act of updating said stored analog signal voltage further comprises the act of converting a digital datastream to a stream of said analog pixel signals, said converting occurring on a semiconductor substrate supporting said emitter element.

23. The method of claim 21, wherein said analog signal voltage is coupled with said emitter element through a read-in-integrated-circuit.

24. A method of displaying a dynamic infrared image from a two-dimensional array of electrically resistive infrared emitter elements, comprising the acts of:

generating a first electrical current in response to a corresponding stored analog signal voltage at each emitter element;

passing each said first electrical current through a corresponding emitter element to an electrical ground terminal during a first frame time;

dissipating an electrical power in response to said first electrical current in said emitter element, such that said emitter element emits a pixel of a first display frame of said infrared image; and updating said stored analog signal voltage with an analog pixel signal, wherein the act of updating said stored analog signal voltage further comprises the act of converting a digital datastream to a stream of said analog pixel signals, said converting occurring on a semiconductor substrate supporting said emitter element.

25. The method of claim 24, wherein said analog signal voltage is coupled with said emitter element through a read-in-integrated-circuit.

26. An apparatus containing a two-dimensional array of infrared emitter elements coupled to a read-in-integrated-circuit comprising:

a unit cell for each of said emitter elements, each of said unit cells having a first sample-and-hold capacitor interconnected with a signal interconnect line through a first sample-and-hold switch and interconnected with a second sample-and-hold capacitor through a second sample-and-hold switch; and said second sample-and-hold capacitor interconnected with said emitter element through an emitter driver, wherein an electrical conductive path connects said emitter element to a circuit ground node.

27. The apparatus of claim 26, wherein said emitter driver is configured as a voltage mode amplifier.

28. The apparatus of claim 26, further comprising an electrical current source in said unit cell interconnected to said circuit ground node along a first current conducting path through said emitter element and along a second current conducting path to said circuit ground node bypassing said emitter element, such that said second current conducting path includes a conducting channel of a biased transistor.

29. The apparatus of claim 28, wherein said electrical current source is a biased transistor.

30. The apparatus of claim 26, wherein said circuit ground node for each of said unit cells is independently interconnected to a system electrical ground terminal through a doped semiconductor layer.

31. The apparatus of claim 26, further comprising a digital to analog converter having an output terminal interconnected with said signal interconnect line, said digital to analog converter and said unit cell being incorporated on a single semiconductor substrate.

32. An apparatus containing a two-dimensional array of infrared emitter elements coupled to a read-in-integrated-circuit, comprising a unit cell for each of said emitter elements, each of said unit cells having a sample-and-hold capacitor interconnected with a signal interconnect line through a sample-and-hold switch and interconnected with said emitter element through a voltage mode amplifier, wherein an electrical conductive path connects said emitter element to a circuit ground node.

33. The apparatus of claim 32, further comprising an electrical current source in said unit cell interconnected to said circuit ground node along a first current conducting path through said emitter element and along a second current conducting path to said circuit ground node bypassing said emitter element, such that said second current conducting path includes a conducting channel of a biased transistor.

34. The apparatus of claim 32, wherein said circuit ground node for each of said unit cells is independently interconnected to a system electrical ground terminal through a doped semiconductor layer.

35. The apparatus of claim 32, further comprising a digital to analog converter having an output terminal interconnected with said signal interconnect line, said digital to analog converter and said unit cell being incorporated on a single semiconductor substrate.

36. An apparatus containing a two-dimensional array of infrared emitter elements coupled to a read-in-integrated-circuit, comprising:

a unit cell for each of said emitter elements, each of said unit cells having a sample-and-hold capacitor interconnected with a signal interconnect line through a sample-and-hold switch and interconnected with said emitter element through an emitter driver, wherein an electrical conductive path connects said emitter element to a circuit ground node; and an electrical current source in said unit cell interconnected to said circuit ground node along a first current conducting path through said emitter element and along a second current conducting path to said circuit ground node bypassing said emitter element, such that;

said second current conducting path includes a conducting channel of a based transistor.

37. The apparatus of claim 36, wherein said circuit ground node for each of said unit cells is independently interconnected to a system electrical ground terminal through semiconductor substrate contacts comprising a doped semiconductor layer.

38. The apparatus of claim 36, further comprising a digital to analog converter having an output terminal interconnected with said signal interconnect line, said digital to analog converter and said unit cell being incorporated on a single semiconductor substrate.

39. The apparatus of claim 36, wherein said electrical current source is a biased transistor.

40. An apparatus containing a two-dimensional array of infrared emitter elements coupled to a read-in-integrated-circuit comprising:
   a unit cell for each of said emitter elements, each of said unit cells having a sample-and-hold capacitor interconnected with a signal interconnect line through a sample-and-hold switch and interconnected with said emitter element through an emitter driver, wherein an electrical conductive path connects said emitter element to a circuit ground node; and
   wherein said circuit ground node for each of said unit cells is independently interconnected to a system electrical ground terminal through a doped semiconductor layer.

41. The apparatus of claim 40, further comprising a digital to analog converter having an output terminal interconnected with said signal interconnect line, said digital to analog converter and said unit cell being incorporated on a single semiconductor substrate.

42. An apparatus containing a two-dimensional array of infrared emitter elements coupled to a read-in-integrated-circuit comprising:
   a unit cell for each of said emitter elements, each of said unit cells having a sample-and-hold capacitor interconnected with a signal interconnect line through a sample-and-hold switch and interconnected with said emitter element through an emitter driver; and
   a digital to analog converter having an output terminal interconnected with said signal interconnect line, said digital to analog converter and said unit cell being incorporated on a single semiconductor substrate;
   wherein an electrical conductive path connects said emitter element to a circuit ground node.

* * * * *